US 9,437,418 B2

(12) United States Patent
Posseme

(10) Patent No.: US 9,437,418 B2
(45) Date of Patent: Sep. 6, 2016

(54) METHOD FOR FORMING SPACERS FOR A TRANSISTOR GATE

(71) Applicant: COMMISSARIAT A L'ENERGIE ATOMIQUE ET AUX ENE ALT, Paris (FR)

(72) Inventor: Nicolas Posseme, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/551,849

(22) Filed: Nov. 24, 2014

(65) Prior Publication Data
US 2015/0162190 A1 Jun. 11, 2015

(30) Foreign Application Priority Data
Nov. 25, 2013 (FR) ..................... 13 61585

(51) Int. Cl.
*H01L 29/76* (2006.01)
*H01L 21/02* (2006.01)
(Continued)

(52) U.S. Cl.
CPC ... *H01L 21/02126* (2013.01); *H01L 21/02164* (2013.01); *H01L 21/02274* (2013.01); *H01L 21/02307* (2013.01); *H01L 21/823468* (2013.01); *H01L 21/84* (2013.01); *H01L 29/41783* (2013.01); *H01L 29/4232* (2013.01); *H01L 29/6653* (2013.01);
(Continued)

(58) Field of Classification Search
CPC ............... H01L 29/41783; H01L 29/66628; H01L 29/66772; H01L 29/4232; H01L 29/785; H01L 29/6653; H01L 29/6656; H01L 21/02126; H01L 21/02274; H01L 21/02307; H01L 21/02164; H01L 21/84; H01L 21/823468; H01L 21/0234; H01L 21/02356
See application file for complete search history.

(56) References Cited

U.S. PATENT DOCUMENTS 4,529,476 A 7/1985 Kawamoto et al.
5,786,276 A 7/1998 Brooks et al.
(Continued)

FOREIGN PATENT DOCUMENTS

GB    2 362 029 A    11/2001

OTHER PUBLICATIONS

U.S. Appl. No. 14/797,345, filed Jul. 13, 2015, Posseme.
(Continued)

*Primary Examiner* — Jerome Jackson, Jr.
*Assistant Examiner* — Wasiul Haider
(74) *Attorney, Agent, or Firm* — Oblon, McClelland, Maier & Neustadt, L.L.P

(57) ABSTRACT

A method for forming spacers of a transistor gate having an active layer surmounted by the gate, including forming a porous layer covering the gate and having a dielectric constant equal to or less than that of silicon oxide, forming a protective layer covering the porous layer and the gate, etching the protective layer anisotropically to preserve residual portions of the protective gate only at the flanks of the gate, forming a modified layer by penetration of ions within the porous layer anisotropically to modify the porous layer over its entire thickness above the gate and above the active layer and so as not to modify the entire thickness of the porous layer on the flanks of the gate, the latter being protected by protective spacers constituting porous spacers, and removing the modified layer by etching to leave the protective spacers in place.

30 Claims, 10 Drawing Sheets

(51) Int. Cl.
  *H01L 21/8234* (2006.01)
  *H01L 21/84* (2006.01)
  *H01L 29/66* (2006.01)
  *H01L 29/78* (2006.01)
  *H01L 29/423* (2006.01)
  *H01L 29/417* (2006.01)

(52) U.S. Cl.
  CPC .... *H01L 29/6656* (2013.01); *H01L 29/66628* (2013.01); *H01L 29/66772* (2013.01); *H01L 29/785* (2013.01)

(56) References Cited

U.S. PATENT DOCUMENTS

| | | |
|---|---|---|
| 6,255,219 B1 | 7/2001 | Xiang et al. |
| 6,380,030 B1 | 4/2002 | Chen et al. |
| 7,288,482 B2 | 10/2007 | Panda et al. |
| 2002/0110972 A1 | 8/2002 | Chen et al. |
| 2003/0207585 A1 | 11/2003 | Choi et al. |
| 2004/0033677 A1* | 2/2004 | Arghavani ........ H01L 21/28176 438/510 |
| 2004/0087155 A1 | 5/2004 | Wieczorek et al. |
| 2008/0272445 A1 | 11/2008 | Dyer |
| 2010/0059887 A1* | 3/2010 | Ueki ................. H01L 21/02126 257/741 |
| 2011/0241128 A1* | 10/2011 | O'Meara ........... H01L 21/28247 257/408 |
| 2013/0164940 A1 | 6/2013 | Raley et al. |
| 2014/0120728 A1 | 5/2014 | Raley et al. |
| 2014/0187046 A1 | 7/2014 | Posseme et al. |

OTHER PUBLICATIONS

French Preliminary Search Report issued Jul. 16, 2014, in French Application No. 13 61585 filed Nov. 25, 2013 (with Written Opinion and English Translation of Categories of Cited Documents).

* cited by examiner

PRIOR ART

PRIOR ART

PRIOR ART

PRIOR ART

METHOD FOR FORMING SPACERS FOR A TRANSISTOR GATE

TECHNICAL FIELD OF THE INVENTION

The present invention concerns in general field effect transistors (FET) used by the microelectronics industry and more particularly the realization of gate spacers of transistors of the metal-oxide-semiconductor (MOSFET) type mainly used for the production of all kinds of integrated circuit.

PRIOR ART

The incessant race for the reduction in size that characterizes the whole microelectronics industry could not have taken place except with the contribution of key innovations throughout the decades of development since the first integrated circuits were produced industrially in the nineteen sixties. A very important innovation that goes back to the nineteen seventies, and which is still used, consists of realizing MOSFET transistors by means of a technique in which the source and drain electrodes are auto-aligned on those of the gate and therefore do not require a photoetching operation for definition thereof. Combined with the use of gates made from polycrystalline silicon, it is the gates themselves, produced first, that serve as a mask during the doping of the source and drain regions of the transistors.

FIG. 1a is a given section of an example of this type of transistor 100 during realization. The source and drain regions 110 can be seen therein, overall designated as source/drain regions, since they are very generally perfectly symmetrical and can fulfil the two roles according to the electrical biasings that are applied to the transistor. The gate conventionally consists of a stacking of layers 120, a major part of which always consists of polycrystalline silicon 123. The formation of the source and drain regions is typically done by ion implantation 105 of dopants in the regions 110, the gate 120 serving as a mask as mentioned above, thus preventing the doping of the region of the MOSFET transistor in which, according to the voltages applied to the gate, the conduction channel 130 between source and drain will be able to develop.

The basic technique, very briefly described above, well known to persons skilled in the art along with numerous variants, has been constantly perfected for the purpose of improving the electrical performances of the transistors while making it possible to accommodate the successive reductions in size of the transistors necessitated by an ever increasing integration of a large number of components in an integrated circuit.

One technique widely used currently consists of manufacturing the integrated circuits starting from elaborate substrates 140 of the silicon on insulator type designated by their acronym SOI. The elaborate SOI substrate is characterized by the presence of a fine surface layer of monocrystalline silicon 146 resting on a continuous layer of silicon oxide 144, referred to as buried oxide or BOX, the acronym for buried oxide layer. The strength and mechanical rigidity of the assembly are provided by the layer 142, which constitutes the body of the SOI substrate often referred by the term "bulk" to indicate that the starting substrate is very generally made from solid silicon. This structure offers numerous advantages for the realization of MOSFET transistors. In particular, it allows a drastic reduction in the stray capacitances because of the presence of the insulating continuous layer 144. With regard to the invention, it will be stated only that the surface layer of monocrystalline silicon 146 can be controlled precisely for thickness and doping. In particular it is advantageous for the performances of the transistors that the channel 130 can be completely depleted of carriers, that is to say "fully depleted" (FD), the term that is generally used to designate this state. This is obtained by realizing the transistors from SOI substrates wherein the superficial layer 146 is very thin, which is not without any inconvenience moreover as will be seen in the description of the invention. This type of transistor is thus designated by the acronym FDSOI.

One improvement to the basic auto-alignment technique that has been universally adopted consists of the formation of spacers 150 on the flanks of the gates. The spacers 150, typically made from silicon nitride (SiN), will in particular enable the use of a so-called "raised source and drain" technique. In order to be able to maintain low electrical resistances for access to the source and drain electrodes, despite the reduction in size of the transistors, it has been necessary in fact to increase the cross section thereof. This is obtained by selective epitaxy of the source/drain regions 110. During this operation the initial layer of monocrystalline silicon 146 will be grown 112 locally. It is then necessary in order to protect the gate regions in order to prevent the growth from also taking place from the polycrystalline silicon 123 of the gate. It is among other things the role of the spacers to fulfil this function. They also fulfil a role of preservation of the gate during the silicidation of the contacts (not shown), which is then performed for the same purpose in order to reduce the serial resistance of access to the electrodes of the transistor.

The formation of the spacers 150 has become a crucial step in the formation of transistors, which now achieved dimensions that are measured normally in nanometers (nm=$10^{-9}$ meters) and which are overall of decananometric sizes. The realization of the spacers is done without involving any photoetching operation. They are auto-aligned on the gate 120 by means of the deposition of a uniform layer of silicon nitride (SIN) 152, which then undergoes a very highly anisotropic etching. This etching of the SIN preferentially attacks the horizontal surfaces, that is to say all the surfaces that are parallel to the plane of the SOI substrate. It leaves in place, imperfectly, only the vertical parts of the layer 152, those substantially perpendicular to the plane of the substrate, in order to obtain in practice the patterns 150 the ideal shape of which will obviously be rectangular.

With the known solutions, the reduction is size of the transistors makes it very tricky to obtain spacers completely fulfilling their role of isolation and not causing any defects in the realization of the transistors from SOI substrates. This is because, in the context of the present invention, and as will be detailed later, it has been found that several types of fault such as those mentioned below appear during the etching of the spacers using one or other of the known anisotropic etching methods.

FIGS. 1b, 1c and 1d each illustrate a type of defect observed.

A type of etching is in particular used that is said to be "dry" and is implemented by means of a method that is usually designated by its acronym RIE, from "reactive-ion etching". This is an etching method in which a plasma is formed, in a confined enclosure, that reacts physically and chemically with the surface of the wafer to be etched. In the case of the etching of a layer of silicon nitride, which is, as seen the preferred material for realizing spacers, the reactive gas is typically methyl fluoride ($CH_3F$), which is caused to react with the material to be etched while also introducing dioxygen ($O_2$) and possibly helium (He). In this way an etching plasma is formed based on fluorine chemistry and often designated by its constituents: $CH_3F/O_2/He$. In this plasma the fluorine compound serves to etch the silicon nitride while the oxygen limits the polymerisation of the methyl fluoride and also serves to oxidise the silicon when this material is reached during etching. The layer of oxide formed on the silicon retards the etching of the silicon at the cost however of a surface transformation of the latter into oxide and therefore a surface consumption of silicon. The helium serves as a diluent for the oxygen. Other reactive gases have been experimented with such as methane ($CH_4$) and sulphur hexafluoride ($SF_6$).

The advantage of this type of etching is that it is fairly anisotropic and sufficiently controls the profile of the spacers 150 even if it is not possible in practice to obtain the ideal rectangular form. The drawback of this type of etching is that the selectivity of attack of this underlying silicon is however limited. The selectivity, that is to say the ratio of the etching speeds between silicon nitride and silicon is around 10 and may at a maximum reach 15 according to the conditions of formation of the plasma (the nitride is etched 10 to 15 times more quickly than the silicon).

So-called "wet" etchings based on hydrofluoric acid (HF) or phosphoric acid ($H_3PO_4$) are also used, which have a much better selectivity, respectively, vis-à-vis silicon or its oxide ($SiO_2$) but which do not however make it possible to control the profile of the spacers since the etching is essentially isotropic in this case. It should be noted here that this type of etching is also referred to as "wet clean".

It should be noted here that there exist many publications on the subject of the etching silicon nitride and/or gate spacers in general. Reference can be made for example to the following American patents or patent applications: 2003/0207585; U.S. Pat. No. 4,529,476; U.S. Pat. No. 5,786,276 and U.S. Pat. No. 7,288,482.

FIG. 1b illustrates a first problem that relates to the insufficient selectivity in attack that exists during dry etching of the $CH_3F/O_2/He$ type between the silicon nitride and the silicon of the superficial layer 146. The result is that a result significant fraction of the thin superficial layer of monocrystalline silicon 146 of the SOI substrate can then be partially consumed 147 during the anisotropic etching of the nitride. As previously mentioned, the superficial layer 146 is chosen so as to have a low thickness in order to improve the electrical characteristics of the transistors. It is typically less than 10 nm. The remaining thickness 145 may be very small. Under these conditions the ion implantation 105 for forming the source and drain regions 110 that will follow is liable to be very detrimental to the remaining monocrystalline silicon. The implantation energy of the dopants may be sufficient to cause complete amorphisation 149 of the monocrystallized silicon, which will then in particular compromise the following step of epitaxial growth 112 intended to form the raised source/drain. As previously mentioned, the latter operation is made necessary because of the reduction in size of the transistors in order to be able to maintain the resistances of access to the source and drain electrodes at sufficiently low values in order not to impact on the electrical functioning of the transistors. A growth from a layer of silicon partially or totally made amorphous will create many defects in the layer formed by epitaxy.

FIG. 1c illustrates another problem where there is not any significant consumption of the silicon of the superficial layer 146 but there is a formation of "feet" 154 at the bottom of the patterns of silicon nitride remaining on the flanks of the gate after etching. The consequence is that the transition 114 of the junctions that are formed after doping by ion implantation 105 of the source and drain regions 110, with the region of the channel 130, is much less abrupt than when the spacers do not have feet, as shown in the previous figures. The presence of feet 154 affects the electrical characteristics of the transistors. It should be noted here that the formation or not of feet at the bottom of the spacers and the consumption or not of silicon of the superficial layer of silicon 146 of the SOI substrate, described in the previous figure, are parameters of adjustment that are opposed to the etching, which require that a compromise can be found for which, ideally, feet are not formed and the superficial layer of silicon is not significantly attacked.

FIG. 1d illustrates a third problem that occurs when the etching produces an excessive erosion of the spacers in the high parts of the gates and bares the polycrystalline silicon 123 in these regions 156. The consequence is that the subsequent epitaxial growth 112 for forming the raised source/drain will also occur at these points, as well as a siliciding of parasitic contacts, which risks causing short-circuits between electrodes. This is because the etching of the spacers requires that the etching time be adjusted in order to etch, for example, 150% of the thickness of nitride deposited. That is to say an overetching of 50% is effected in this example in order to take account of the non-uniformity of the deposition, or of the etching operation itself, at a wafer. Thus, in some parts of the wafer, it can be seen that there is an excessively pronounced overetching that bares the gate regions 156. This type of defect is also termed "faceting".

FIGS. 2a to 2i illustrate how the problems related to plasma etching are posed more specifically when MOSFET transistors of the FinFET type are realized, another transistor structure that is beginning to be used by the microelectronics industry for technological nodes as from 22 nm. In the FinFET structure the conduction channel consists in a thin vertical blade of silicon, referred to as a "fin". It is surrounded on three sides by the control gate. This makes it possible in particular to obtain transistors having better electrical performances and also to reduce leakage currents.

FIGS. 2a to 2i describe the main steps of formation of a FinFET transistor and the difficulties encountered. FIGS. 2a, 2b and 2c illustrate more particularly the formation by etching of a layer 710 of a crystalline semiconductor, usually silicon, three-dimensional patterns, that is to say the "fins", that will form the conduction channel 730 of the transistors. The form of the channels is defined by a hard mask 720 that is transferred by etching into the layer 710. This layer is for example the superficial layer of monocrystalline silicon of an SOI substrate already described and therefore rests on a continuous layer of oxide and a substrate (not shown).

FIGS. 2d, 2e and 2f illustrate the formation of the gate of the transistors. As with the FDSOI transistors the gate consists of a stacking of layers that are successively deposited on the patterns 730 that will constitute the channels. There is therefore the fine insulating layer of gate oxide 740 and the layer 750 made from a high-permittivity (high-k) insulating material covered by a metal gate. The whole is covered by a layer of polycrystalline silicon 760 that has been planed and on which the hard masks 770 and 780, which will make it possible, by etching of the above stacking of layers, to form the gate and the source and drain electrodes of the transistors, are deposited and defined by photolithography.

FIGS. 2g, 2h and 2i illustrate the following operations where the etching of the gate layers is carried out, which makes it possible to release, from each pattern 730, the source and drain regions 732 on either side of the gate and to define the length of the channels 734. As with the FDSOI transistors, there is also a need for spacers. They are obtained, after deposition of a continuous layer generally made from silicon nitride, by means of a very anisotropic etching of this layer that leaves in place only the vertical patterns 790 on the flanks of the gate.

Like FTSOI transistors, FinFET transistors therefore suffer, for realization thereof, from the limitations and imperfections of plasma etching. In particular, in order to realize this transistor structure, the etching used must have excellent selectivity vis-à-vis silicon (Si) and its oxide ($SiO_2$), which is difficult to obtain, as seen, with plasma etching. As indicated in FIGS. 2g and 2i, the integrity of the angles of the etched patterns is affected thereby. This is because, for the FinFET transistor to have good performances, the edges 701 of the fins must form angles that are as straight as possible, any rounding of these angles giving rise to a reduction in the performances of the transistor. The same applies to the angle formed by the spacers and the layer on which it rests, typically the layer of silicon. This angle is indicated in a broken line in FIG. 2i.

For the reasons indicated above, the current solutions are based on plasma etchings not making it possible to obtain edges forming right angles.

It is therefore seen that plasma etching, though it has made it possible to follow the reductions in size of the patterns at each introduction of a new technological node in the past years, does however more and more pose problems when the size decreases, in particular beyond the technological node of 22 nm. The use of plasma etching for these dimensions introduces an additional degree of complexity for attempting to overcome the problems described above. Etching chemistries more complex than the traditional one, referred to as fluorocarbon chemistry, have been tested, which require introducing additional gases into the etching chamber. Up to five different gases have been combined in order to form the etching plasma. The prime consequence of this is to make the method considerably more complex.

The three-dimensional (3D) character of the FinFET structure means that the problems disclosed previously for realizing transistors of the FDSOI type are posed with even more acuity for the realization of the FinFETs. It should be noted moreover that the realization of this structure requires having recourse not only to anisotropic etching for realizing spacers 790 on the flanks of the gate electrodes but that it is also possible to etch the flanks of the source/drain electrodes 732 while having recourse to isotropic etching.

The aim of the present invention is to propose a method for forming spacers fully fulfilling their role of isolation and which would eliminate or limit defects in the production of transistors.

The other objects, features and advantages of the present invention will emerge from an examination of the following description and the accompanying drawings. Naturally other advantages may be incorporated.

SUMMARY OF THE INVENTION

To achieve this objective, one aspect of the present invention concerns a method for forming spacers of a gate of a field effect transistor, the gate being situated on top of an active layer made from a semiconductor material, the method comprising a step of forming a protective layer covering at least the gate of the transistor; the method further comprising a step of forming a porous layer, a step of etching the protective layer, a modification of the porous layer in order to form a modified layer, and a step of removing the modified layer.

The step of forming the porous layer is performed before the step of forming the protective layer. The porous layer obtained is situated between the gate and the protective layer and has a dielectric constant k equal to or less than that of silicon oxide ($SiO_2$). Next the step of etching the protective layer is performed anisotropically so as to preserve residual portions of the protective layer only at the flanks of the gate, these residual portions constituting protective spacers for the gate. A modification of the protective layer is effected anisotropically by the penetration of ions, preferably issuing from a plasma, in the porous layer. The modified layer is obtained by modifying the porous layer over its entire thickness above the gate and above the active layer so as not to modify the entire thickness of the porous layer situated on the flanks of the gate. The porous layer situated on the flanks of the gate is in fact protected by the protective spacers. The porous layer situated on the flanks of the gate is in fact protected by the protective spacers. The porous layer that remains on the flanks of the gate constitutes porous spacers for the gate. The step of removing the modified layer is then performed so as to leave the protective spacers in place, by performing a selective etching of the modified layer vis-à-vis the semiconductor material of the active layer.

The combination of two layers of spacers, one (the protective layer) preferably made from nitride, the other made from a porous dielectric with a low dielectric constant, improves the performances of the transistors while limiting the appearance of the problems mentioned above.

This is because the porous dielectric, once modified by the ions of the plasma, is consumed very easily and with selectivity vis-à-vis the semiconductor material of the active layer (typically silicon), much greater than the selectivity of the SiN (or $Si_3N_4$) spacers normally used with respect to the Si, as provided for by the known solutions. This is because the known solutions provide an etching solution based on hydrofluoric acid (HF), which consumes the nitride at a rate of 0.5 nm/minute and with a selectivity of the nitride with respect to silicon of around 20 to 30. With the invention, the selectivity of the modified porous layer for example of SiOCH with respect to Si is greater than 100. This therefore considerably improves the selectivity and therefore the precision of the etching.

It is thus avoided excessively consuming the active layer, uncovering the flanks of the gate or forming feet. Furthermore, when the ions of the plasma are injected and the porous layer situated outside the flanks of the gate is removed, the protective spacers protect the porous layer covering the flanks. The latter is therefore not altered by the injection of the ions and remains in place. The dimensional control is therefore improved compared with a solution without a protective nitride layer.

The dielectric constant of a transistor according to the invention is particularly low, which improves the performances of the transistor.

In particular, the reduced capacitance of the transistor according to the invention increases its operation speed and reduces its electrical consumption.

According to a particularly advantageous embodiment, the porous layer is modified by ion implantation in the porous layer using a plasma comprising said ions.

Plasma implantation has the advantage of enabling implantation continuously in a space extending from the surface of the implanted layer.

Furthermore the use of a plasma allows implantation at lower depths than the minimum depths that can be obtained with implanters. Thus plasma implantation makes it possible to effectively and relatively evenly or at least continuously implant fine thicknesses that can then be removed by selective etching. This continuity of implantation from the implanted face improves the homogeneity of the modification according to the depth, which leads to a speed of etching of the implanted layer that is constant over time. Moreover, the increase in selectivity conferred by implantation vis-à-vis other layers is effective from the very start of the etching of the implanted layer. Plasma implantation thus allows significantly improved control of the etching precision.

Plasma implantation typically makes it possible to implant and then remove thicknesses extending from the surface of the implanted layer and over a depth ranging from 0 nm to 100 nm. Conventional implanters allow implantation in a space lying between 30 nm and several hundreds of nanometers. On the other hand, conventional implanters do not make it possible to implant species between the surface of the layer to be implanted and a depth of 30 nm. In the context of the development of the present invention, it has been remarked that implanters do not then make it possible to obtain a sufficiently constant speed of etching of the modified layer, and this from the surface of the latter, thus leading to lower precision of etching compared with what is allowed by the invention. Moreover, the use of a plasma for modifying the layer makes it possible not to modify the active layer situated under the porous layer.

The use of a plasma for modifying the layer to be removed is therefore particularly advantageous in the context of the invention, which aims to remove a fine thickness of porous layer, typically between 1 and 10 nm and more generally between 1 and 30 nm, without degrading the underlying layer, typically the active layer of the SOI transistor.

The modification step performed using a plasma modifies the porous layer continuously from the surface of the porous layer and over a thickness of between 1 nm and 30 nm and preferably between 1 nm and 10 nm and preferably equal to 5 or 6 nm.

According to a particularly advantageous embodiment, the implantation and removal of the porous layer are effected in the same plasma reactor. Modification of the layer to be removed performed by a plasma implantation thus makes it possible to modify the layer and carry out etching in the same chamber, which is very advantageous in terms of simplification, time and cost of the method.

Other optional features of the invention, which can be implemented so as to be combined in all combinations or alternatively, are indicated below:

Advantageously, the active layer is on top of the insulating layer and a supporting substrate. The active layer, the insulating layer and the supporting substrate define together a structure of the silicon on insulator (SOI) type.

Advantageously, the thickness of the active layer is less than 30 nm and preferably less than 20 nm. It is preferably between 3 and 30 nm.

Advantageously, on either side of the gate, the porous layer is disposed directly in contact with the active layer.

Advantageously, the porous layer has a dielectric constant less than that of the protected spacers.

Preferentially but non-limitatively, the etching step and the modification are performed in the course of a single step during which the ions used for etching the protective layer modify the porous layer in order to form the modified layer.

The etching carried out at the etching step is performed by means of a plasma based on argon (Ar), oxygen ($O_2$) or nitrogen ($N_2$).

Preferably, the plasma comprises only argon (Ar), oxygen ($O_2$) or nitrogen ($N_2$).

The porous layer is modified by the penetration of ions of a plasma. This plasma is configured, in particular in terms of its energy and the nature of the ions, so that the ions have sufficient energy to cause depletion of the bonds in the porous dielectric material. According to a particular embodiment, the modification is carried out by means of a plasma based on argon (Ar), $O_2$ or $N_2$.

According to a preferred example, the step of forming the protective layer is performed in order to form a protective layer with a thickness of between 2 nanometers (nm) and 3 nm.

Preferably the protective layer has a dielectric constant of less than or equal to 7.

The material of the protective layer is compatible with dry or wet cleaning carried out at the step of removing the modified layer.

The material of the protective layer is chosen so as to resist the selective etching (by dry or wet method) performed at the step of removing the modified layer. Advantageously, the protective layer is a layer of nitride only or a layer of silicon nitride (for example $Si_3N_4$ or SiN). In another embodiment, the protective layer is a layer of boron nitride (BN). It may also be a layer of $SiO_2$, non-porous SiOCH or silicon-carbon-boron-nitrogen (SiCBN).

Advantageously, the step of forming the porous layer is performed in order to form a porous layer the thickness of which is less than 20 nm and preferably less than 10 nm, typically 5 or 6 nm.

Advantageously the modification of the porous layer performed by means of a plasma is carried out so as to implant the porous layer continuously from the surface of the porous layer by means of which the plasma ions penetrate. This makes it possible to modify the porous layer over its entire thickness and from its free face. There is thus no superficial area of the porous layer that is not implanted. The speed of etching of the porous layer can be more uniform. The etching of the porous layer is then better controlled and the risks of over-etching the porous layer are eliminated. This advantage is all the greater when the active layer is thin, as is the case in transistors where the thickness of the active layer is less than 30 or 20 nm. This is because, if the active layer is thin, unintentional etching of a portion of thickness of the active layer greatly degrades the performances of the transistor. Moreover, by better controlling the etching of porous layer placed directly in contact with the active layer outside the gate, a portion of the porous layer remaining on the active layer is prevented, which would also have had the consequence of degrading the performances of the transistor.

The modification step performed using a plasma modifies the porous layer continuously from the surface of the porous layer and over a thickness of between 1 nm and 30 nm and preferable between 1 nm and 10 nm.

The step of forming the porous layer is for example performed by a plasma assisted chemical vapour deposition (PECVD), so as to form a porous layer with a thickness of between 5 nm and 6 nm.

Typically the porous layer has a dielectric constant of less than 7 and preferably less than 4 and preferably less than 3.1 and preferably less than or equal to 2; such a protective layer may be termed a low-k layer, that is to say with a low dielectric constant.

Preferentially, the porous layer is a porous SiOCH layer.

The modified layer is formed from silicon oxide ($SiO_2$).

The step of removing the modified layer is performed by wet etching selective with respect to said semiconductor material of the active layer.

The semiconductor material is silicon and the step of removing the modified layer is performed by wet etching selectively with respect to the silicon (Si). Preferentially but not limitatively, the etching selective with respect to silicon at the step of removing the modified layer is obtained by a solution based on hydrofluoric acid (HF).

Alternatively, this removal step is performed by dry etching selective with respect to said semiconductor material of the active layer.

The semiconductor material is silicon and the step of removing the modified layer is performed by dry etching selective with respect to silicon (Si). Preferentially but non-limitatively, the dry etching is performed in a plasm based on nitrogen trifluoride ($NF_3$) and ammonia ($NH_3$).

Advantageously, the dry etching comprises: an etching step consisting of the formation of solid salts; a step of sublimation of the solid species. This embodiment makes it possible to obtain very good selectivity of the etching of the modified porous layer with respect to the non-modified porous layer and the non-modified semiconductor material. In particular, this selectivity of the etching is very much superior (typically by a factor of at least 10) to that obtained with an HF solution.

Said modification is performed so as to modify the porous layer throughout its thickness over all the surfaces parallel to the plane of the substrate on which the gate rests and not to modify the porous layer throughout its thickness on the surfaces perpendicular to this plane.

The gate is situated on a stack of layers forming an elaborate substrate of the silicon on insulator (SOI) type.

The semiconductor material is taken from: silicon (Si), germanium (Ge), and silicon-germanium (SiGe).

The step of removing the modified layer is performed so as to preserve the porous layer on the flanks of the gate.

After the step of removing the modified layer the portions of porous layer covering the flanks of the gate are entirely covered by the protective spacers formed by the protective layer.

The transistor is an FDSOI transistor.

The transistor is a FinFET transistor.

According to one embodiment, after the step of removing the modified layer, a step of removing the protective spacers covering the flanks of the gates is performed. This step is obtained by etching by means of a solution based on phosphoric acid ($H_3PO_4$). This solution makes it possible to define the dielectric constant solely from the porous material. This embodiment makes it possible to etch the nitride without consuming the porous material or the active layer.

Preferably, the protective layer is in contact with the active layer. Preferably, the protective layer is in contact with the porous layer. Preferably, the porous layer is in contact with the flanks of the gate formed by a semiconductor material.

Another aspect of the present invention concerns a microelectronic device comprising at least one stack comprising a gate on top of an active layer of semiconductor material, the active layer being on top of an insulating layer and a supporting substrate, and spacers disposed on flanks of the gate. The spaces comprise: porous spacers covering the flanks of the gate and having a dielectric constant equal to or less than that of silicon oxide ($SiO_2$).

According to an optional embodiment, the transistor comprises protective spacers covering the porous spacers and having a dielectric constant equal to or less than 7.

Optionally, the device may comprise at least any one of the following features taken alone or in combination:

Advantageously, the thickness of the active layer is less than 30 nm and preferably less than 20 nm.

Advantageously, the thickness of the porous layer is less than 10 nm. Advantageously it is equal to 5 or 6 nm.

Advantageously, on either side of the gate, the porous layer is disposed directly in contact with the active layer.

Advantageously, the porous spacers are made from porous SiOCH.

In another embodiment, the porous spacers are formed from a material with a dielectric constant equal to or less than that of porous SiOCH.

Preferably, the protective spacers are made from nitride and for example silicon nitride such as $Si_3N_4$ or SiN.

In another embodiment, the protective spacers are made from boron nitride (BN), $SiO_2$, non-porous SiOCH or SiCBN.

The thickness of the protective spacers is between for example 0.5 nm and 2 nm and is preferably equal to 1 nm.

The thickness of the porous spacers is between for example 5 nm and 6 nm.

BRIEF DESCRIPTION OF THE FIGURES

The aims, objects, features and advantages of the invention will emerge more clearly from the detailed description of an embodiment thereof that is illustrated by the following accompanying drawings, in which.

The accompanying drawings are given by way of examples and are not limitative of the invention. These drawings are schematic representations and are not necessarily to the scale of the practical application. In particular, the relative thicknesses of the layers and substrates do not represent reality.

DETAILED DESCRIPTION OF THE INVENTION

In the context of the present invention, the term "on", "surmounts", "cover" or "underlying" or the equivalent thereof do not necessarily mean "in contact with". Thus for example the deposition of a first layer on a second layer does not necessarily mean that the two layers are directly in contact with each other but means that the first layer at least partially covers the second layer while being either directly in contact therewith or being separated from it by another layer or another element.

In the following description, the thicknesses are generally measured in directions perpendicular to the plane of the bottom face of the layer to be etched or of a substrate on which the bottom layer is disposed. Thus the thicknesses are generally taken in a vertical direction on the figures depicted. On the other hand the thickness of a layer covering a flank of a pattern is taken in a direction perpendicular to this flank.

The dielectric constants are for example measured by the well-known so-called "mercury probe" method, meaning by mercury drop.

As has been seen, one object of the invention is to dispense with all or at least some of the problems mentioned above.

Figure 3:
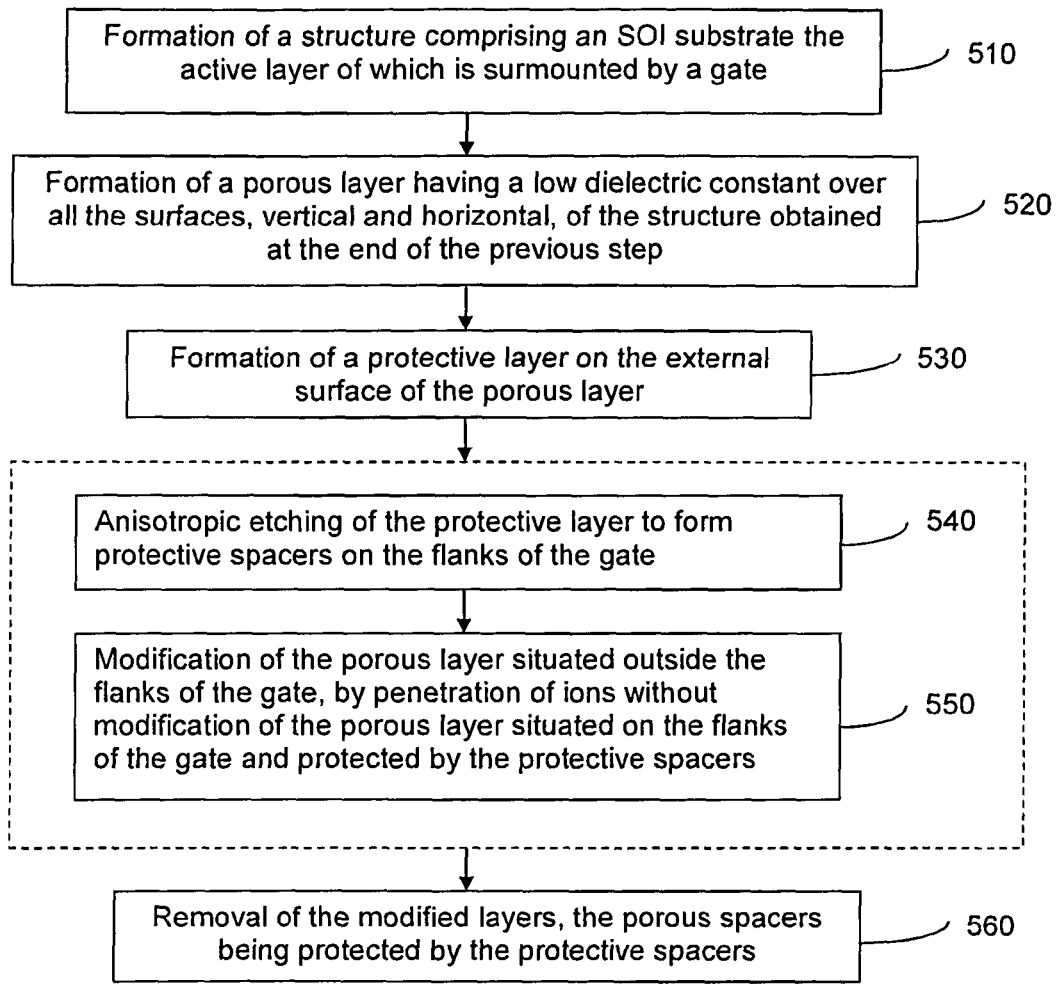
FIG. 3 summarises the main steps of a detailed example of a method for forming spacers of a transistor according to the invention applied to the producing of FDSOI transistors.

FIG. 3 summarises the main steps 510 to 560 of a detailed example of a method for forming spacers of a transistor according to the invention, applied to the production of transistors of the FDSOI type. These steps 510 to 560 can also apply to the formation of spacers on the flanks of a gate of a FinFET transistor. Steps 510 to 560 will respectively be detailed in the following paragraphs concerning FIGS. 4a to 4e and 7 illustrating respectively a structure of a transistor 200 obtained at the end of one of the steps 510 to 560 according to one embodiment of the invention.

Figure 4A:
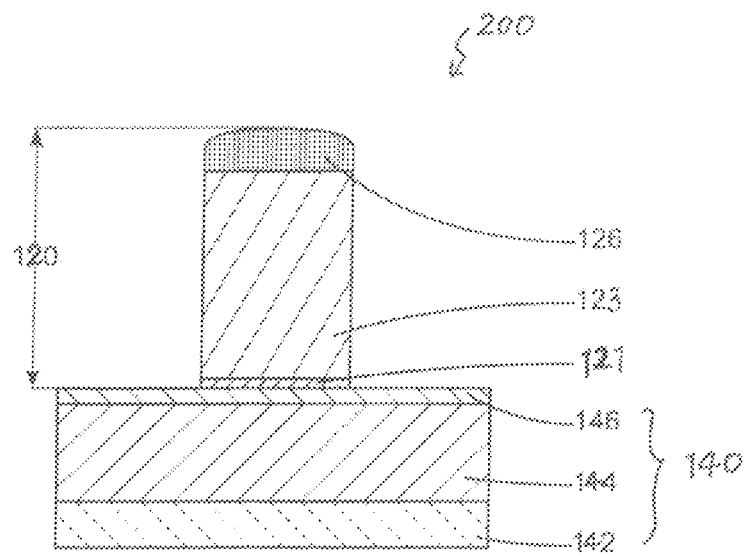
FIGS. 4a to 4e illustrate respectively a structure of a transistor obtained at the end of one of the steps of the method according to an embodiment of the invention.

FIG. 4a illustrates a structure of an SOI transistor 200 the active layer 146 of which is surmounted by a gate 120. This FIG. 4a is obtained at the end of step 510 of FIG. 3.

This step 510 consists of producing an elaborate substrate 140 of the SOI type, from a substrate 142, often referred to as a bulk substrate, an initial insulating layer 144 and the active layer 146, the latter preferably being made from semiconductor material and intended to form later a conduction channel of the transistor 200.

Alternatively, the semiconductor material is taken from: germanium (Ge), silicon germanium (SiGe).

In addition to a polycrystalline silicon layer 123, there are, in a stack of layers forming the gate 120, first of all a thin insulating layer of gate oxide 121 through which an electrical field will be able to develop in order to create an underlying conduction channel between source and drain when a sufficient electrical voltage is applied to the gate 120. In the most recent MOSFET transistors, use is made of a technology referred to by the English term "high-k/metal gate", that is to say the dielectric layer 121 is made from a high-permittivity (high-k) insulating material covered with a metal layer (metal gate; not illustrated in the figures) of the gate 120. This technology was developed in particular in order to reduce leakage currents through the gate 120 that become much too great because of the reduction in the thickness of the dielectric layer 121 to atomic dimensions. At this stage, the stack of layers of the gate 120 also comprises a protective hard mask 126 that will be removed later to allow resumption of contact on this electrode. This hard mask 126, which remains in place after etching of the gate, is typically made from silicon oxide ($SiO_2$). Its role is to protect the top of the gate 120 from any damage during the performance of the following steps and in particular the steps of etching the spacers.

Preferably, the dielectric layer 121 is disposed in contact with the active layer 146 forming the conduction channel. Preferably, the metal layer is disposed in contact with the dielectric layer 121. Preferably, the layer of polycrystalline silicon 123 is disposed directly in contact with the gate oxide formed by the dielectric layer 121 if the metal layer is absent or is disposed directly in contact with the metal layer.

Figure 4B:
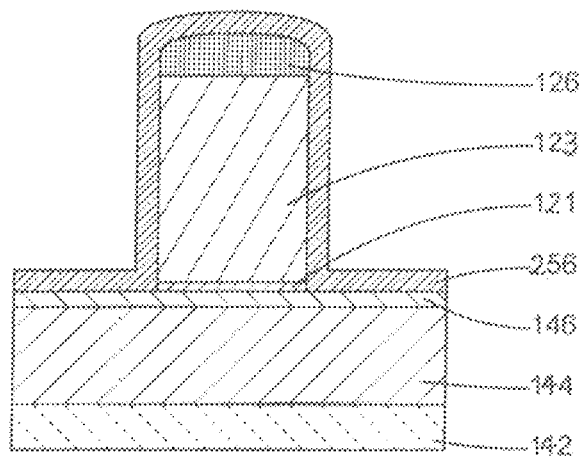

FIG. 4b illustrates the structure obtained at the end of the step 520 of forming a porous layer 256 having a low dielectric constant.

The porous layer 256 obtained at the end of step 520 having a low dielectric constant k equal to or less than a value of 4, preferably between 2.1 and 3. The porous layer 156 obtained is preferably made from porous SiOCH.

Even more advantageously but non-limitatively the dielectric constant k is equal to or less than that of porous SiOCH.

In addition, the material of the porous layer 256 is sufficiently sensitive to the plasma ions used later so that this porous layer 256 can be transformed in order to form a modified layer 166 (described later). Furthermore, this porous layer 156 is able to be removed selectively with respect to the semiconductor material such as the silicon of the active layer 146 and the material of the protective layer 152 formed at step 530 (described later).

This step 520 is preferably performed by means of a so-called PECVD deposition method (the acronym for "Plasma-Enhanced Chemical Vapour Deposition". This type of deposition, which is carried out at atmospheric pressure, affords in fact a uniform deposition over all the surfaces whatever their orientation. In this way a deposition is obtained that can be termed conforming.

Thus, preferably, the porous layer 256 obtained has a preferentially substantially uniform thickness, over all the surfaces, vertical and horizontal, of the devices being manufactured.

Preferentially but not limitatively, the porous layer 256 is disposed directly in contact with the layer of polycrystalline silicon 123 at the flanks of the gate 120 and also in contact with the active layer 146.

Preferably, the thickness of the porous layer 256 is between 5 nanometers (nm) and 6 nm in order to have a total spacing thickness, defined by the whole of the porous layer 256 and a protective layer 152 described later, formed by 9 nm.

The porosity of the porous layer 256 is preferably between 5% and 70% and preferably between 10% and 50% and preferably between 15% and 40%. The higher porosity of the porous layer 256 means that the porous layer 256 is more sensitive to a plasma applied later during a following step 550. The more porous the layer 256, the more it will easily be modified as indicated below.

Figure 1A:
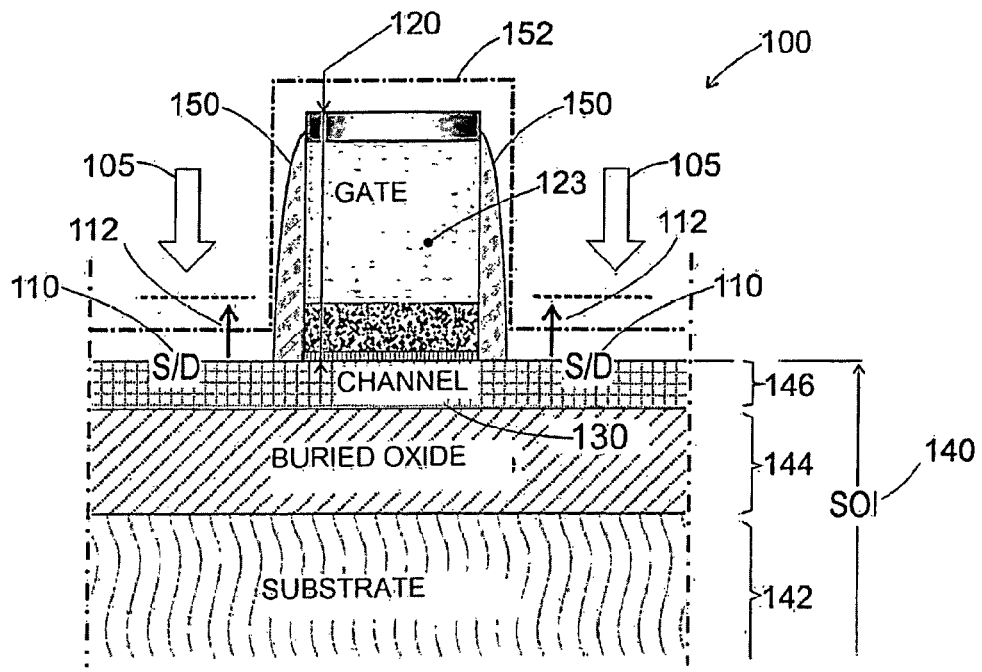
FIGS. 1a to 1d show firstly a view in cross section of an example of a MOSFET transistor of the FDSOI type in the course of production and, secondly, illustrate various defects that may be observed on structures of FDSOI transistors when the spacers are etched using one or other of the standard anisotropic etching methods developed by the microelectronic industry.
Figure 4C:
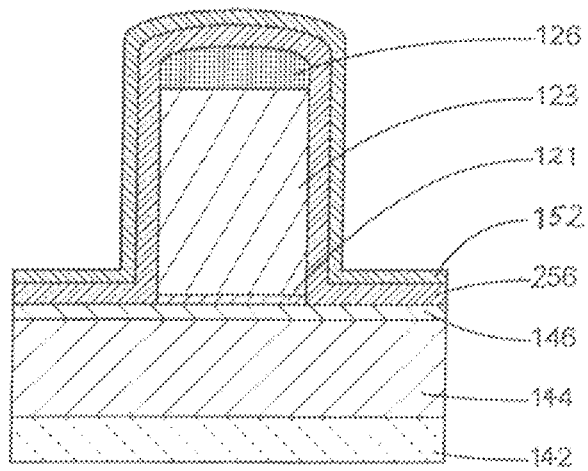

FIG. 4c illustrates a step 530 of forming a protective layer 152, with a preferentially substantially uniform thickness, on the top surface of the porous layer 256, that is to say on all the surfaces (vertical and horizontal) of the devices being manufactured. At this step 530, which is no different from the corresponding step of the known methods and which has already been mentioned in FIG. 1a, is preferably performed by means of a so-called LPCVD deposition method, the acronym for "low pressure chemical vapour deposition". This type of deposition, which is carried out at atmospheric pressure, affords in fact a uniform deposition over all the surfaces whatever their orientation.

The protective layer 152 obtained at the end of step 530 is preferably a nitride layer, such as a layer of silicon nitride of a chemical compound $Si_3N_4$ or SiN. In another embodiment, the protective layer 152 is a layer of non-porous boron nitride (BN), $SiO_2$, SiCBN or SiOCH or a layer having a dielectric constant equal to or less than that of silicon nitride.

In addition, the material of the protective layer 152 must be compatible with dry or wet cleaning carried out at a following step 560 in order to remove a modified layer (166) (described later).

Preferentially but non-limitatively, the protective layer 152 is disposed directly in contact with the porous layer 256.

The thickness of the protective layer 152 is preferably sufficiently great so that, after the performance of the etching step 540, residual portions 152a, 152b of the protective layer 152 remain at the flanks of the gate 120. These residual portions 152a, 152b will be used to protect portions 256a, 256b of the porous layer 256 at the flanks of the gate 120 when a following step 550 (described later) is performed. These residual portions 152a, 152b thus form protective spacers or protective layers for the porous layer 256. The protective spacers extend over the entire height of the flanks of the gate 120.

In a preferred embodiment, the thickness of the protective layer 152 is between 2 nm and 3 nm. The consumption of the thickness of the protective layer 152 during the following etching step 540 is approximately between 1 nm and 2.5 nm. Said residual portions 152a, 152b will therefore have, after the etching step 540, a thickness of between 0.5 nm and 2 nm, preferably 1 nm.

Figure 4D:
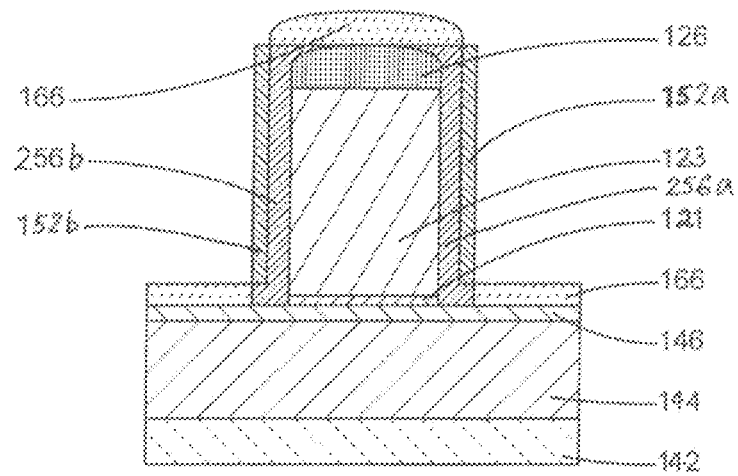

FIG. 4d illustrates the structure of the transistor 200 at the end of the step 540 of etching the protective layer 152 and modification 550 of the porous layer 256.

The etching step 540 is carried out anisotropically and so as to preserve the residual portions 152a, 152b of the protective layer 152 only at the flanks of the gate 120. These residual portions 152a, 152b will constitute protective spacers 152a, 152b for the gate 120, for example nitride spacers. Preferably, these spacers cover the whole of the flanks of the gate 120.

Preferentially but non-limitatively, the etching 540 is carried out in a plasma reactor of the inductive or capacitive type, to form an argon (Ar) plasma.

An example of implementation of step 540 will be provided in a following paragraph concerning the modification 550 of the porous layer 256.

Said residual portions 152a, 152b, that is to say the protective spacers 152a, 152b for the gate 120, have a thickness of between 0.5 nm and 2 nm, preferably 1 nm.

Next, the modification 550 of the porous layer 256 as formed at the step 520 is done by penetration of species within the porous layer 256 in order to form a modified layer 166. This modification 550 is carried out anisotropically and so as to modify the porous layer 256 over its entire thickness above the gate 120 and above the active layer 146, leaving in place non-modified portions 256a, 256b of the porous layer 256 at the flanks of the gate 120. Thus, at the flanks of the gate 120, the porous layer 256 is not modified.

More precisely, during this modification 550, a slight deflection of the plasma ions takes place on the flanks of the structure obtained at the end of the previous step 540. The thickness of the protective spacers 152a, 152b is chosen so as to be sufficiently thick so that the ions of this deflection do not reach the porous spacers 256a, 256b. Typically, the deflection of the ions occurs in the protective layer over a thickness of between 1 to 2 nm. In this case, the thickness of the protective layer 152 formed at the previous step 530 must not be less than 2 nm and will preferably be between 2 and 3 nm.

Thus the thickness of the porous layer 256 situated at the flanks of the gate 120 therefore does not receive ions or does not receive sufficient of them to be modified. On the other hand, the portions of the porous layer 256 that are not situated on the flanks of the gate receive ions from the plasma and are modified thereby.

As indicated previously, the modification of the porous layer is effected by implantation by means of a plasma. This has the advantage of allowing continuous implantation from the free surface of the porous layer and over a small thickness, typically between 0 and 30 nm, or even between around 5 or 6 nm. It also makes it possible to benefit from improved selectivity as from the start of the etching and a constant etching speed, leading to an improved etching precision. It also makes it possible to effect the modification and removal of the modified porous layer in the same chamber.

The use of a plasma for implanting the porous layer thus makes it possible to remove a very fine porous layer without risking etching the underlying active layer 146.

The plasma may comprise varied types of ion (such as argon, $O_2$ or $N_2$ ions taken separately or in the form of a mixture), for the length of time that the nature of these ions and the parameters of the plasma, in particular its energy, make it possible to ensure depletion of the methyl groups of the porous material. Thus this penetration of the plasma ions breaks the bonds of the porous material of the porous layer 256

In the present embodiment, this modification 550 is preferably made by using a plasma of the argon type.

Preferentially but non-limitatively, the species of a plasma used for making said modification 550 of the porous layer 256 are the species already used as the basis of the plasma etching performed at the previous step 540 of etching the protective layer 152.

For example, in the present embodiment, the argon ions present in the plasma make it possible initially (at the etching step 540) to etch, anisotropically, the protective layer 152 of $Si_3N_4$ or SiN, keeping the residual portions 152a, 152b of the protective layer 152 at the flanks of the gate 120, and then modifying, also anisotropically, the porous layer 256 of porous SiOCH by converting it into porous $SiO_2$ when the porous layer 256 is in contact with said argon plasma or an $O_2$ plasma. The ion bombardment breaks the methyl groups in the porous layer 256 of SiOCH when the latter is converted into $SiO_2$ while the SOI substrate 140 is not impacted by said ion bombardment. Thus the modified layer 166 obtained at the end of the modification 550 is a layer for example of porous silicon oxide ($SiO_2$).

The protective spacers 152a, 152b of the gate 120 protect, as mentioned above, the non-modified portions 256a, 256b of the porous layer 256 during this modification 550. The non-modified portions 256a, 256b then constitute porous spacers 256a, 256b situated between the gate 120 and the protective spacers 152a, 152b.

An example of implementation of step 540 in an argon plasma etching reactor for etching 3 nm of the protective layer 152 followed by a modification 550 of the entire thickness of 6 nm of the porous layer 256 of porous SiOCH is implemented as a function of time in seconds and the power of the bias in watts, as described below:

| | |
|---|---|
| Etching reactor: | Argon plasma of 250 sccm |
| Thickness of the protective layer 152 to be etched: | 3 nm |
| Thickness of the porous layer 256 of porous SiOCH to be modified: | 6 nm |
| Power of the source: | 500 watts |
| Biasing power (energy of ions) | 200 watts |
| Pressure: | 10 millitorr |
| Temperature: | 50° C. |
| Time: | 60 seconds |

Advantageously, the implantation parameters, in particular the energy communicated to the ions and the implantation duration and dose are provided so that the modified layer 166 can subsequently (step 560) be etched selectively with respect to the active layer 146.

Advantageously, these parameters are also adjusted so that the modified layer 166 can be etched selectively with respect to the protective spacers (said residual portions) 152a, 152b.

Advantageously, these parameters are also adjusted so that the modified layer 166 can be etched selectively with respect to a layer made from an oxide, typically an oxide of said semiconductor material, the latter forming for example a gate oxide layer. Typically, the etching is selective for the material such as the porous silicon oxide $SiO_2$ of the modified layer 166 formed by means of the argon plasma vis-à-vis the active layer 146 and the protective spacers (residual portions) 152a, 152b.

In accordance with the embodiment described above, it may therefore be preferred to use a plasma etcher for performing the etching step 540 and the modification 550 in a single step, in particular for the following reasons:
 the cost of the equipment is lower;
 the manufacturing cycle times may be shorter since the step 540 of etching the protective layer 152 and the modification 550 of the porous layer 256 may then be done in the same equipment without venting the devices to air during manufacture.

The etching 540 results from a conventional physico-chemical reaction and preferably comprises an etching by $CH_3F$ with $O_2$ and He.

On the other hand, in another embodiment, the modification 550 can be made independently of the etching step 540, for example by plasma using ion species distinct from those used for the etching step 540, which may be advantageous.

The implantation is done for example in a plasma of the $O_2$ type. It should be noted here that this step 550 of modifying the porous layer 256 to be etched can be performed in numerous different ways by adapting all kinds of means normally employed by the microelectronics industry. Where use is made in particular of standard etchers, with which it is possible to develop plasmas at low or high density and where it is possible to control the energy of the ions to allow the implantation of species such as the aforementioned Ar, $N_2$, $O_2$, He, H intended to modify the porous layer 256 to be etched. It is also possible to use a so-called immersion type of plasma normally used for effecting an implantation of species on the surface of a device during manufacture.

The modification step 550 is advantageously highly anisotropic for forming porous spacers 256a, 256b on the flanks of the gate 120 because of the directionality of the ions of the plasma. It therefore preferentially affects the horizontal surfaces, that is to say all the surfaces parallel to the plane of the elaborate substrate 140. The modified layer 166 obtained therefore comprises the modified thickness of the porous layer 256 above the top surface of the active layer 146 and the one above the top surface of the hard mask 126 of the gate 120. The thickness of the porous layer 256 on the vertical surfaces with respect to the plane of the elaborate substrate 140, that is to say on the lateral surfaces of the gate 120, is protected by the protective spacers 256a, 256b and therefore preserved in order to form the porous spacers 256a, 256b.

Typically, as mentioned in the above example, a thickness of 6 nm of the porous layer 256 on the horizontal surfaces can be modified during this operation. In addition, a total thickness of spacing of the gate 120 is between 7 nm and 8 nm, this total thickness being defined by the assembly formed by the protective spacers 152a, 152b and the porous spacers 256a, 256b.

The modified thicknesses of the porous layer 256 depend on the implementation conditions, in particular the means employed (plasma).

Figure 4E:
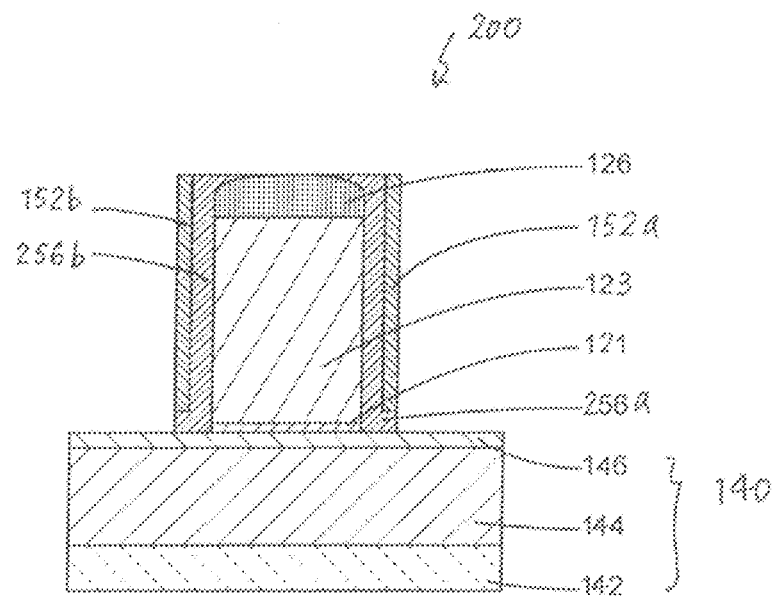

FIG. 4e illustrates the end result of the removal step 560 after the etching has been carried out, that is to say the removal of the modified layer 166.

For removing the modified layer 166 of porous silicon oxide ($SiO_2$), a wet etching based on hydrofluoric acid (HF) that combines the removal of the modified layer 166 with wet cleaning of the wafer containing the devices being manufactured is advantageously but non-limitatively used since, after this wet etching, conventionally a wet clean is carried out in order to clean to a wafer on which the transistor 200 is situated. This wet method will therefore be favoured for removing the modified layer 166 selectively in respect of the silicon of the active layer 146 while cleaning the wafer. This simplifies the method and affords a saving in time.

By way of example, in order to remove a thickness of between 5 nm and 6 nm of the porous silicon oxide of the modified layer 166, around 15 seconds are needed with a 1% solution of hydrofluoric acid (HF). This period obviously depends directly on the thickness of the porous layer 256 that has been modified.

This step 560 can be performed repeatedly. Preferably, if the thickness of the porous layer 256 formed at step 520 is between 5 and 6 nm, as indicated in the above example, this removal step 560 is performed in one pass by virtue of the very great reactivity of the porous SiOCH that has been modified (into porous $SiO_2$) of the modified layer 166. On the other hand, if the porous layer 256 has a thickness greater than 6 nm, it is then possible to envisage effecting several sequences of the steps 560. The number of sequences is calculated according to the speed of etching of the first sequence.

This etching is stopped on the protective spacers 152a, 152b and/or on the monocrystalline silicon of the active layer 146 and/or on the hard mask 126 at the top of the gate 120 until the modified layer 166 disappears on all the horizontal surfaces. The porous SiO₂ that forms the modified layer 166 is etched very rapidly compared with the (dense) SiO₂ of the hard mask 126.

Figure 1B:
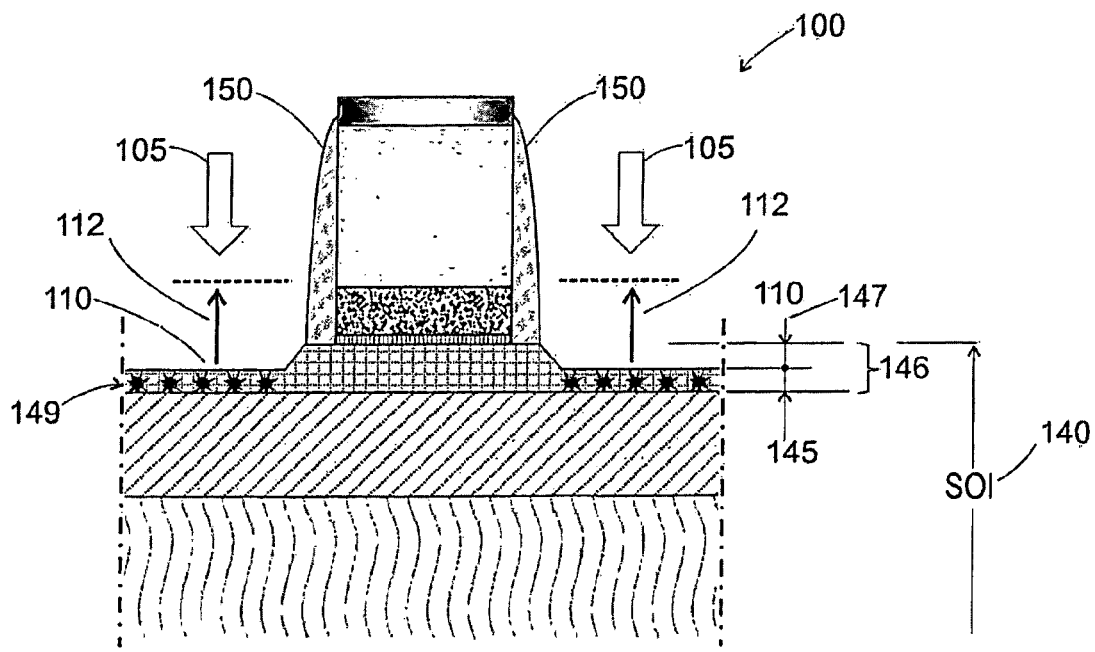
Figure 1C:
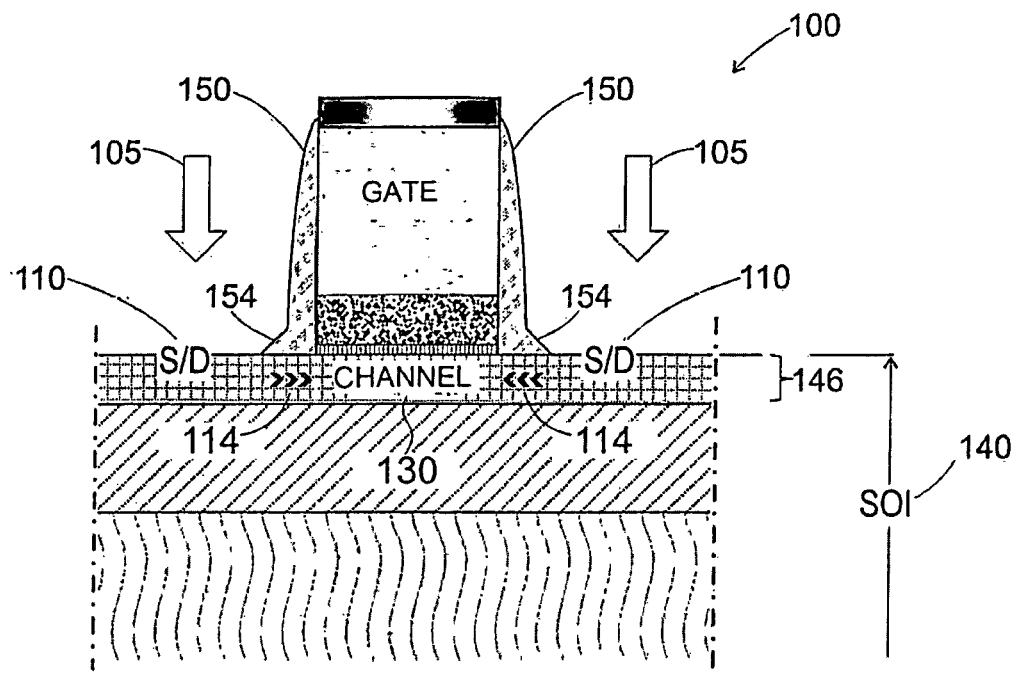
Figure 1D:
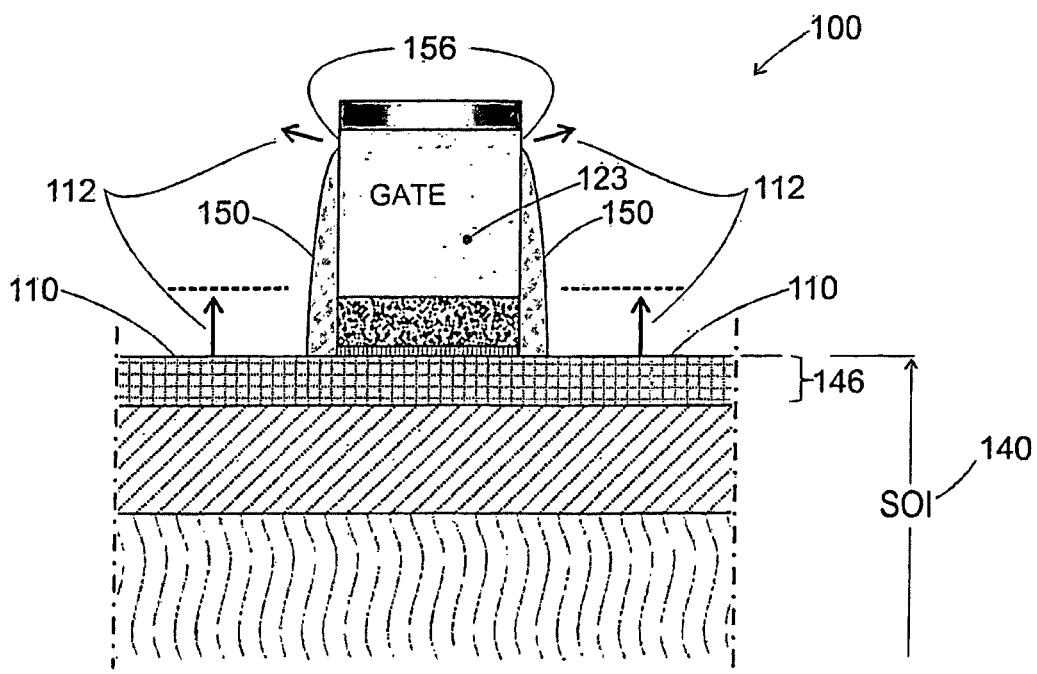
Figure 2A:
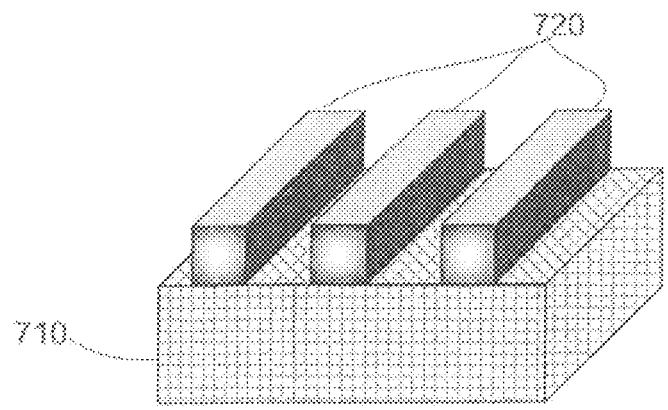
FIGS. 2a to 2i illustrate the three-dimensional (3D) structure of an example of a MOSFET transistor of the FinFET type and the etching problems that are posed in this case.
Figure 2B:
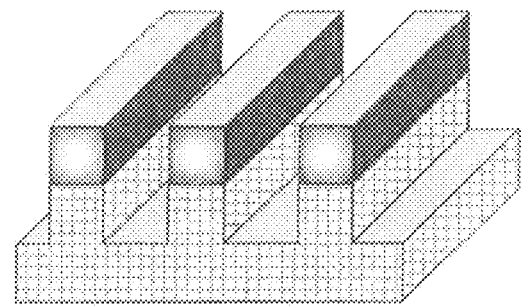
Figure 2C:
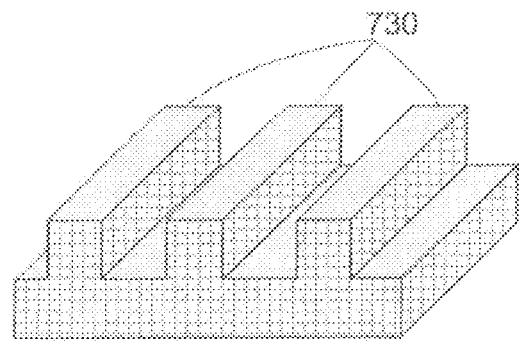
Figure 2D:
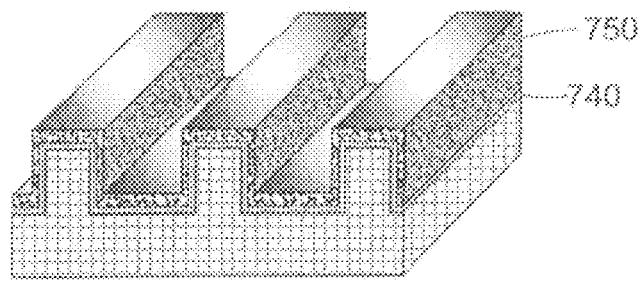
Figure 2E:
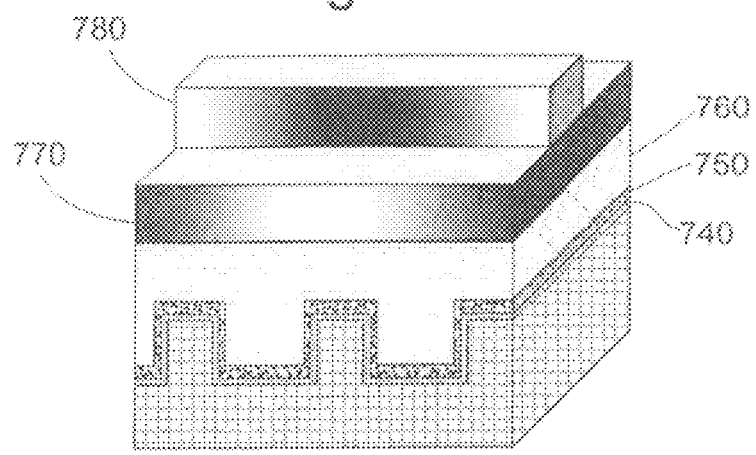
Figure 2F:
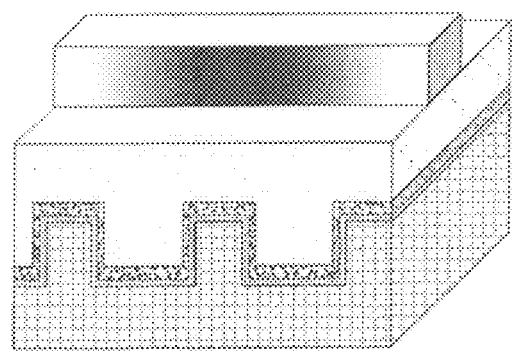
Figure 2G:
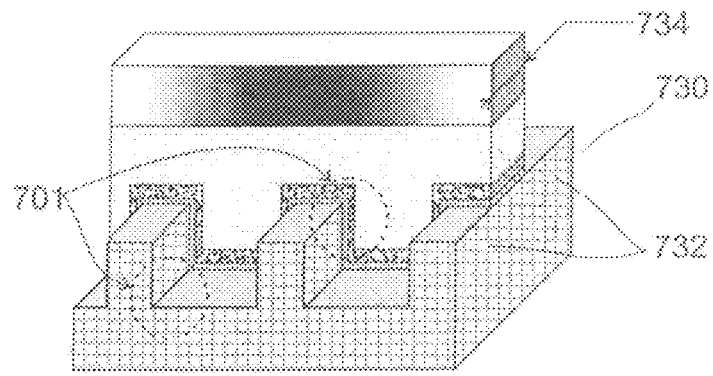
Figure 2H:
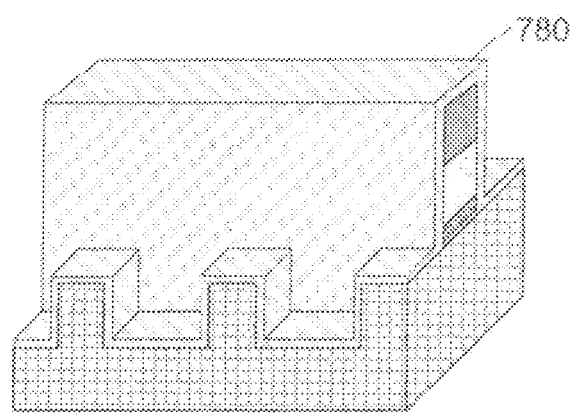
Figure 2I:
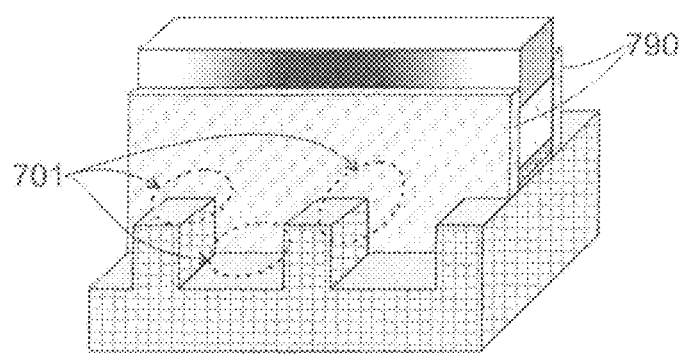

In order to avoid the problems of the conventional methods for etching the spacers described in FIGS. 1b to 1d, it is necessary for the etching of the modified layer 166 to be as selective as possible with respect to the silicon in particular in order not to attack the silicon of the active layer 146. For example, in this wet etching embodiment, there is no consumption of silicon of the active layer 146 due to the use of the etching solution based on hydrofluoric acid (HF).

At the end of this operation, there therefore remain only vertical patterns, mainly on the flanks of the gate 120; that is to say the non-modified portions 526a, 526b of the porous layer 526 then constituting the porous spacers of 526a, 526b of the gate 120 of the transistor 200 of the FDSOI type. In addition, the modified layer 166 can also be etched for producing spacers of a three-dimensional transistor of the FinFET type.

Dry etching of the of the modified porous layer 166 selective with respect to the silicon of the active layer 146, to the material of the protective spacers 152a, 152b and to the silicon oxide (SiO₂) of the hard mask 126 of the gate 120 can then be also carried out for this step of dry removal of the modified layer 166. It should be noted here that this type of dry etching is also referred to as "dry clean".

The method is that described by H Nishini and his co-authors in a publication in English entitled "Damage-free selective etching of Si native oxides using NH₃/NF₃ and SF₆/H₂O down flow etching" that appeared in the "Journal of Applied Physics" volume 74 (2), in July 1993.

Figure 5:
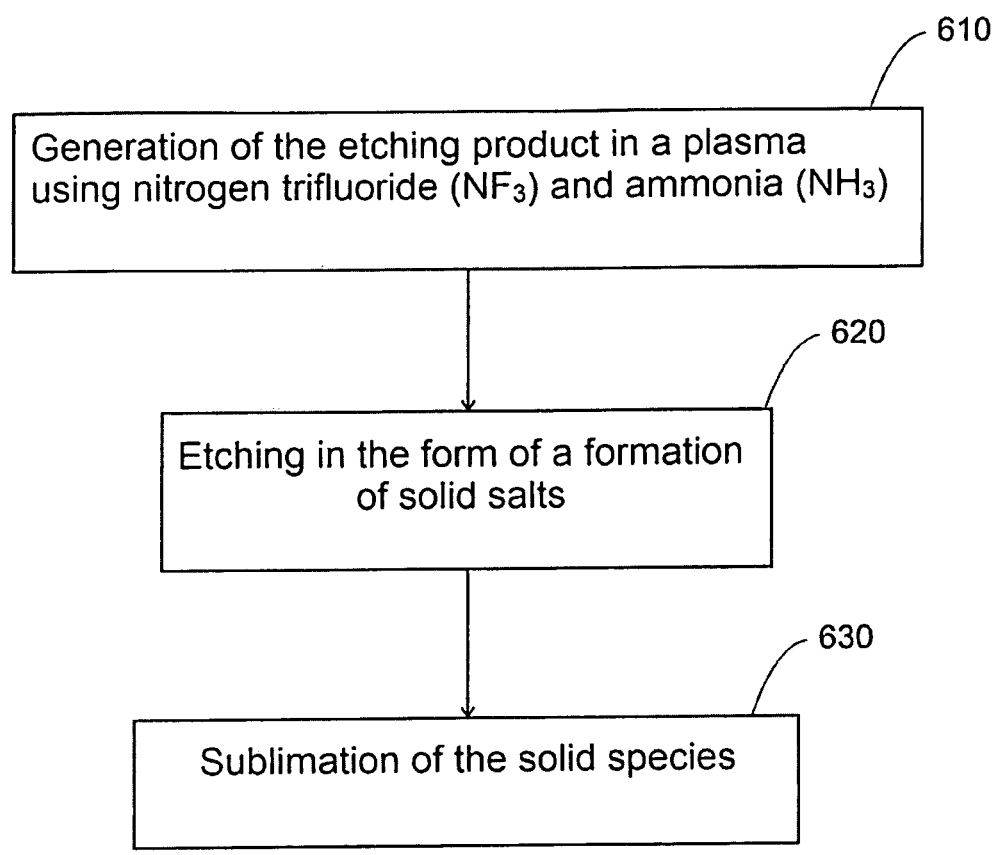
FIG. 5 shows the steps of the removal by dry method of the modified layer that was modified by implantation, for example, of hydrogen.

The principle of the dry removal of the modified layer 166 comprises the following steps 610 to 630 illustrated in FIG. 5, which is carried out in a reaction chamber where a plasma is formed. The treated thicknesses are typically between 1 nm and a few tens of nanometers, typically less than 30 nm.

A first step 610 consists of generating the etching product in the plasma in accordance with the following chemical reaction:

NF₃+NH₃→NH₄F+NH₄F.HF which makes nitrogen trifluoride (NF₃) react with ammonia (NH₃).

The etching is done during a second step 620, at a temperature of around 30° C. and more generally between 10° C. and 50° C., in the form of a formation of salts in accordance with the following chemical reaction:

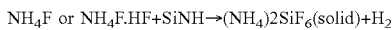

NH₄F or NH₄F.HF+SiNH→(NH₄)2SiF₆(solid)+H₂ during an operation that lasts for between a few seconds and a few minutes and which is performed at a pressure of between a few millitorr and few torr.

The solid species that are formed during this operation are then sublimated 630 at a temperature above 100° C. for a few tens of seconds in accordance with the following reaction:

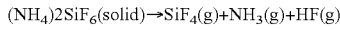

(NH₄)2SiF₆(solid)→SiF₄(g)+NH₃(g)+HF(g)

For example, in order to remove a layer of 6 nm of porous SiOCH from the porous layer 256, the flows of nitrogen trifluoride (NF₃) and ammonia (NH₃) are respectively 5 sccm and 300 sccm at 30° C. for 20 seconds for the step 620 of formation of the salts, which is followed by the sublimation step 630 that takes place at 180° C. for 60 seconds.

This embodiment makes it possible to obtain very good selectivity of the etching of the modified porous layer with respect to the non-modified porous layer, to the non-modified semiconductor material and to the protective layer. In particular, this selectivity of the etching is very much superior (typically by a factor of at least 10) to that obtained with a solution of HF.

Figure 6:
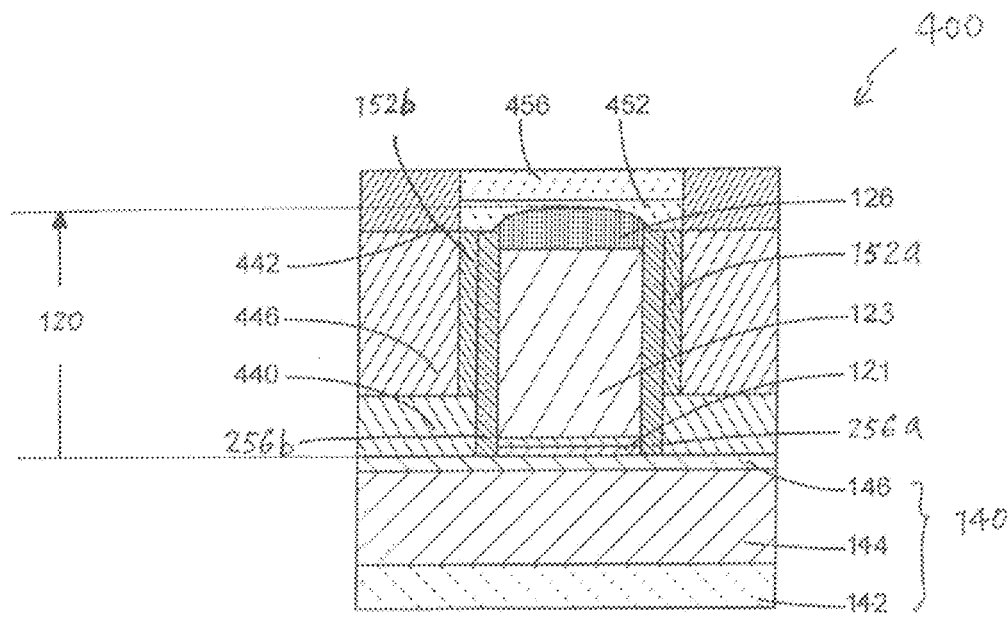
FIG. 6 shows a first example of the final structure of an FDSOI transistor according to one embodiment of the invention.

FIG. 6 illustrates a final structure of an FDSOI transistor 400 according to one embodiment of the invention.

The transistor 400 comprises an elaborate substrate 140, an active layer 146 of which is surmounted by a gate 120 formed by the performance of step 510 for example. The transistor 400 further comprises, on the flanks of the gate 120, protective spacers 152a, 152b and porous spacers 256a, 256b situated on the flanks of the gate 120 and preferably formed by performing the steps 520 to 560 mentioned above, the porous spacers 256a, 256b being situated between the gate 120 and the protective spacers 152a, 152b. The transistor 400 also comprises a source and drain (S/D) 440 disposed in contact with the active layer 146 and the protective spacers 152a, 152b. It also comprises a pre-contact layer 446 disposed above the S/Ds 440 in contact with the protective spacers 152a, 152b. This pre-contact layer 446 extends from the S/Ds 440 and over a height corresponding to the top of the gate 120, so as to fit flush with the latter but without covering the latter.

It also comprises a contact layer 442 surmounting the pre-contact layer 446 and disposed in line with the latter. This contact layer 442 is intended to form a connection region of the transistor 400. The transistor 400 also comprises a contact edge stop layer (CESL) 452 covering the top of the gate 120 and preferably disposed in contact with the hard mask 126. It also comprises a pre-metal dielectric (PMD) layer 456, as illustrated in FIG. 6.

To form this transistor, at the end of the step 560 of removal of the modified layer 166, that is to say when the modified layer 166 has finished being removed on all the horizontal surfaces, a so-called "wet cleaning" operation is carried out, usually referred by the English term "wet clean" as already previously noted.

The source and drain electrodes 440 and the transistor 400 can then be formed. According to a preferential but non-limitative embodiment, a doping that will delimit the source and drain 440 and therefore the length of a channel of the transistor 400 can be done by ion implantation. The source and drain 440 are preferably of the raised type and preferably formed by epitaxial growth.

The other elements 446, 442, 452, 456 of the transistor 400 as described above are implemented conventionally. The information on the elements of the transistor 400 such as their sizings and the dielectric constant are provided in the following table.

| Parameters | Characteristics | Parameters | Characteristics |
| --- | --- | --- | --- |
| Gate dielectric | Thickness = 2.3 nm, k (dielectric constant) = 20 | Raised S/Ds | Thickness = 15 nm, α = 70° |
| Gate metal | Thickness = 5 nm | Pitch | 64 nm |
| Polysilicon gate | Thickness = 40 nm, $L_G$ = 14 nm | Contact | Thickness = 26 nm |
| Gate cap. | Width = 6 nm | CESL | Thickness = 4 nm, k = 7 |
| Protective spacers and porous spacers | Thickness = 2.3 nm, k = 7 | PMD | Thickness = 36 nm, k = 3.9 |

It should be noted that the elements 446, 442, 452, 456 of the transistor 400 are illustrated in FIG. 6 in order to show a final structure of the transistor 400. The present invention is therefore not limited to implementation methods nor to materials of the elements 446, 442, 452, 456 of the transistor 40.

Figure 7:
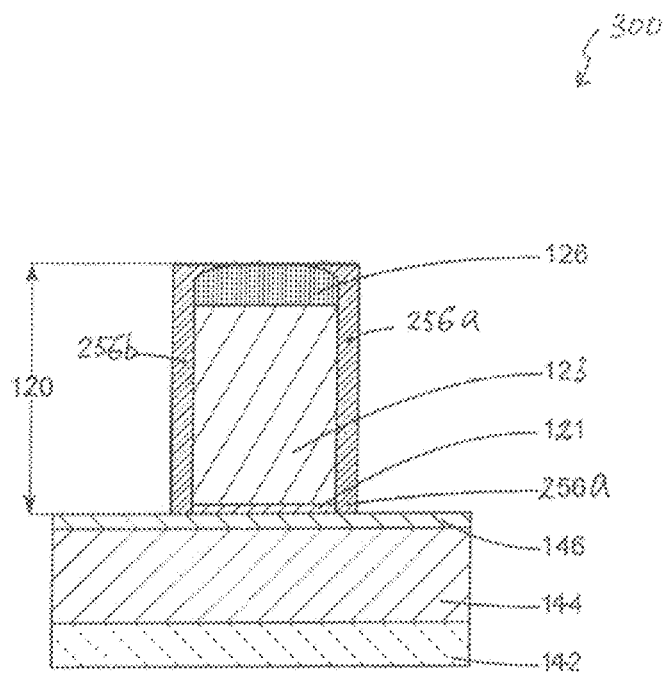
FIG. 7 illustrates a second example of the final structure of a transistor according to another embodiment of the invention in which the transistor comprises only porous spacers.

FIG. 7 illustrates another transistor 300 according to the invention, this transistor 300 comprising only porous spacers 526a, 526b.

According to the present embodiment, the method comprises, in addition to the previously described steps 510, 560, an additional removal step performed in order to remove the protective spacers 152a, 152b already formed at the flanks of the gate 120. This additional removal step can be performed for example by wet method using an etching solution based on phosphoric acid ($H_3PO_4$). This solution has the advantage of etching the nitride of the protective spacers 152a, 152b without consuming the porous SiOCH of the porous spaces 256a, 256b or the silicon of the active layer 146 of the elaborate substrate 140.

The transistor 300 therefore comprises only porous spacers 526a, 526b and thus has a dielectric constant that corresponds to that of the porous spacers 526a, 562b, which makes it possible for example to reduce the overall dielectric constant of the structure.

In summary, the method of the invention allows in particular anisotropic etchings and the anisotropic modification all performed very selectively with respect to a semiconductor material such as silicon. In addition, the method makes it possible to form porous spacers and protective spacers all having a sufficiently low dielectric constant, such as that of porous SiOCH lying between 2.1 and 3 and that of silicon nitride (SiN) of 7.

The method of the invention proves to be particularly advantageous for forming spacers for MOSFET or FinFET transistors.

The method of the present invention overcomes in particular the problems detailed previously in the case where the spacers of the gate are formed only from silicon nitride, the problems concerning for example the excessive consumption of silicon of the active layer, the formation of feet at the spacers of the gate at the interface with the SOI substrate as described in FIGS. 1b and 1c as well as the erosion of the gate spacers as described in FIG. 1d.

The method of the present invention also overcomes another problem detailed below of dimensional control of porous spacers formed from a single porous SiOCH material.

This is because, when this porous SiOCH material is exposed to an argon etching plasma, even with a weak bombardment on the flanks of the gate, the porous SiOCH is modified over several nanometers. The modified porous SiOCH is then consumed during the HF cleaning step while the silicon of the active layer of the elaborate substrate is not consumed. The modification of the porous SiOCH thus makes it difficult to control the dimensions of the porous spacers of the gate.

Thus the combined use of two materials forming two spacers up against each other, comprising a nitride spacer and a porous dielectric spacer 256, makes it possible to overcome the above problems. The protective spacers 152a, 152b protect the porous spacers 256a, 256b on the flanks of the gate 120 when the steps of the method of the invention are performed.

In addition, a transistor manufactured by the method of the present invention has reduced capacitance, which thus increases the operating speed of the transistor and reduces the electrical consumption of the circuits. The invention consequently improves the performance of the transistors.

The invention is not limited solely to the embodiments and examples described above but extends to all embodiments falling within the scope of the claims.

The invention claimed is:

1. A method for forming spacers of a gate of a field effect transistor, the gate being situated above an active layer made from semiconductor material surmounting an insulating layer and a supporting substrate, the active layer, the insulating layer and the supporting substrate defining a stack of the silicon on insulator (SOI) type, comprising a step of forming a protective layer covering at least the gate of the transistor, the method comprising:

before the step of forming the protective layer, a step of forming a porous layer between the gate and the protective layer, the porous layer having a dielectric constant k equal to or less than that of silicon oxide ($SiO_2$);

after the step of forming the protective layer, a step of etching the protective layer performed anisotropically so as to preserve residual portions of the protective layer solely at the flanks of the gate, these residual portions constituting protective spacers of the gate so as to uncover the porous layer outside the flanks of the gate;

a modification to the porous layer performed by ion penetration within the porous layer in order to form a modified layer, said modification of the porous layer being performed by means of a plasma, the ions of which penetrate the uncovered porous layer, said modification being carried out anisotropically and so as to modify the porous layer over its entire thickness above the gate and above the active layer and so as not to modify the entire thickness of the porous layer situated on the flanks of the gate, the porous layer situated on the flanks of the gate being protected by the protective spacers and constituting porous spacers for the gate; and at least one step of removing the modified layer by means of a selective etching of the modified layer vis-à-vis said semiconductor material of the active layer and the protective spacers protecting the porous layer situated on the flanks of the gate.

2. The method according to claim 1, wherein the porous layer has a dielectric constant less than that of the protective spacers.

3. The method according to claim 1, wherein the etching the protective layer and the modification are performed during a single step during which the ions used for etching the protective layer modify the porous layer in order to form the modified layer.

4. The method according to claim 1, wherein the etching the protective layer is performed by means of a plasma based on argon (Ar), oxygen ($O_2$) or nitrogen ($N_2$).

5. The method according to claim 1, wherein the plasma used for the modification of the porous layer is based on argon (Ar), oxygen ($O_2$) or nitrogen ($N_2$).

6. The method according to claim 1, wherein the step of forming the protective layer is performed in order to form a protective layer, with a thickness of between 2 manometers (nm) and 3 nm.

7. The method according to claim 1, wherein the step of forming the porous layer is performed in order to form a porous layer with a thickness of less than 20 nm, and the modification of the porous layer performed by means of a plasma is carried so as to implement the porous layer continuously from the surface of the porous layer through which the ions of the plasma penetrate.

8. The method according to claim 7, wherein the modification step carried out using a plasma modifies the porous layer continuously from the surface of the porous layer and over a thickness of between 1 nm and 30 nm.

9. The method according to claim 1, wherein the step of forming the porous layer is carried out in order to form a porous layer with a thickness of between 5 nm and 6 nm.

10. The method according to claim 1, wherein, on either side of the gate, the porous layer is disposed directly in contact with the active layer.

11. The method according to claim 1, wherein the active layer as a thickness of less than 30 nm.

12. The method according to claim 1, wherein the step of forming the porous layer is performed by a plasma assisted chemical vapour deposition (PECVD) method.

13. The method according to claim 1, wherein the material of the protective layer is chosen so as to resist the selective etching carried out at the step of removing the modified layer.

14. The method according to claim 1, wherein the protective layer is a layer of nitride such as a layer of silicon nitride.

15. The method according to claim 1, wherein the protective layer is a layer of boron nitride (BN), $SiO_2$, non-porous SiOCH or SiCBN.

16. The method according to claim 1, wherein the porous layer is a layer of porous SiOCH.

17. The method according to claim 1, wherein the dielectric constant of the porous layer is between 2.1 and 3, and preferably equal to or less than that of porous SiOCH.

18. The method according to claim 1, wherein the modified layer is formed by porous silicon oxide ($SiO_2$).

19. The method according to claim 1, wherein the step of removing the modified layer is carried out by wet etching selective with respect to said semiconductor material of the active layer.

20. The method according to claim 1, wherein the semiconductor material is silicon and wherein the step of removing the modified layer is performed by wet etching selectively with respect to silicon (Si) using a solution based on hydrofluoric acid (HF).

21. The method according to claim 1, wherein the semiconductor material is silicon and wherein the step of removing the modified layer is performed by dry etching selective with respect to silicon (Si), the dry etching being carried in a plasma based on nitrogen trifluoride ($NF_3$) and ammonia ($NH_3$).

22. The method according to claim 21, wherein the dry etching comprises:
   an etching step consisting of the formation of solid salts:
   a step of sublimation of the solid species.

23. The method according to claim 1, wherein said modification made so as to modify the porous layer throughout its thickness over all-surfaces parallel to a plane of the substrate on which the gate rests and so as not to modify the porous layer throughout its thickness on the surfaces perpendicular to this plane.

24. The method according to claim 1, wherein the step of removing the modified layer is performed so as to preserve the porous layer on the flanks of the gate.

25. The method according to claim 1, wherein the transistor is an FDSOI transistor.

26. The method according to claim 1, wherein the transistor is a FinFET transistor.

27. The method according to claim 1, comprising, after the step of removing the modified layer, a step of removing the protective spacers covering the flanks of the gate, obtained by etching using a solution based on phosphoric acid ($H_3PO_4$).

28. The method according to claim 7, wherein the step of forming the porous layer is performed in order to form a porous layer with a thickness of less than 10 nm.

29. The method according to claim 8, wherein the modification step carried out using a plasma modifies the porous layer continuously from the surface of the porous layer and over a thickness of between 1 nm and 10 nm.

30. The method according to claim 11, wherein the active layer has a thickness of less than 20 nm.

* * * * *